United States Patent
Chen et al.

(10) Patent No.: US 10,692,981 B2
(45) Date of Patent: Jun. 23, 2020

(54) MEMORY DEVICE AND MANUFACTURING METHOD THEREOF

(71) Applicant: eMemory Technology Inc., Hsinchu (TW)

(72) Inventors: Yen-Ting Chen, Hsinchu County (TW); Ming-Shan Lo, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 16/286,609

(22) Filed: Feb. 27, 2019

(65) Prior Publication Data
US 2019/0326304 A1    Oct. 24, 2019

Related U.S. Application Data

(60) Provisional application No. 62/659,150, filed on Apr. 18, 2018.

(51) Int. Cl.
*H01L 29/40* (2006.01)
*G11C 7/06* (2006.01)
(Continued)

(52) U.S. Cl.
CPC ............ *H01L 29/408* (2013.01); *G11C 5/147* (2013.01); *G11C 7/065* (2013.01); *G11C 7/08* (2013.01); *G11C 7/12* (2013.01); *G11C 17/16* (2013.01); *G11C 17/18* (2013.01); *H01L 21/022* (2013.01); *H01L 21/0217* (2013.01); *H01L 21/0226* (2013.01); *H01L 21/02107* (2013.01); *H01L 21/02109* (2013.01); *H01L 21/02112* (2013.01); *H01L 21/02225* (2013.01); *H01L 21/02247* (2013.01); *H01L 21/28202* (2013.01);
(Continued)

(58) Field of Classification Search
CPC ......... H01L 21/02107; H01L 21/02109; H01L 21/02112; H01L 21/0217; H01L 21/022; H01L 21/02225; H01L 21/02247; H01L 21/0226; H01L 21/28202; H01L 29/0603; H01L 29/0607; H01L 29/0638; H01L 29/408

See application file for complete search history.

(56) References Cited

U.S. PATENT DOCUMENTS 5,523,616 A * 6/1996 Den ................... H01L 23/3171
257/637
7,015,100 B1    3/2006 Lee et al.
2012/0086068 A1    4/2012 Horch

FOREIGN PATENT DOCUMENTS

CN    101257026    9/2008
TW    I566383    1/2017

* cited by examiner

*Primary Examiner* — Eduardo A Rodela
(74) *Attorney, Agent, or Firm* — JCIPRNET

(57) ABSTRACT

A memory device and a manufacturing method thereof are provided. The memory device includes a first gate structure, a second gate structure, an oxide layer and a nitride layer. The first gate structure and the second gate structure are disposed on a substrate. The oxide layer covers the first gate structure. The nitride layer is disposed on the substrate and covers the oxide and the second gate structure. The refraction index of a portion of the nitride layer adjacent to an interface between the nitride layer and each of the first gate structure and the second gate structure is about 5% to 10% less than the refraction index of the remaining portion of the nitride layer.

13 Claims, 5 Drawing Sheets

(51) Int. Cl.
*G11C 7/12* (2006.01)
*G11C 5/14* (2006.01)
*G11C 17/16* (2006.01)
*G11C 17/18* (2006.01)
*H01L 21/28* (2006.01)
*H01L 27/11517* (2017.01)
*G11C 7/08* (2006.01)
*H01L 21/02* (2006.01)
*H01L 29/06* (2006.01)

(52) U.S. Cl.
CPC .... *H01L 27/11517* (2013.01); *H01L 29/0603* (2013.01); *H01L 29/0607* (2013.01); *H01L 29/0638* (2013.01); *H01L 29/40114* (2019.08); *H01L 29/40117* (2019.08)

MEMORY DEVICE AND MANUFACTURING METHOD THEREOF

CROSS-REFERENCE TO RELATED APPLICATION

This application claims the priority benefit of U.S. provisional application Ser. No. 62/659,150, filed on Apr. 18, 2018. The entirety of the above-mentioned patent application is hereby incorporated by reference herein and made a part of this specification.

TECHNICAL FIELD

The present invention is related to a memory device and a manufacturing method thereof, and more particularly to a memory device with improved data retention characteristics and a manufacturing method thereof.

BACKGROUND

A memory device has the advantages of multiple operations such as storing, reading, erasing, etc., and the stored data does not disappear after power-off. Thus, a memory device has been widely used in personal computers and electronic equipment.

Generally, in the process of forming a memory device, after a floating gate structure is formed, a nitride layer is formed on the floating gate structure and serves as an etching stop layer for the subsequent contact forming process. The nitride layer is a so-called contact etching stop layer (CESL). However, the contact etching stop layer usually has defects therein and causes charge accumulation, thus affecting the device performance during the operation of the memory device.

For example, after the memory device is programmed, in a high temperature environment (in 150° C.–300° C. range), the charge stored in the floating gate moves toward the contact etching stop layer due to the charge accumulated in the contact etching stop layer, and accordingly accumulates in a region of the floating gate adjacent to the contact etching stop layer, thus generating polarization phenomenon. As a result, the amount of current flowing through the underlying channel region is decreased, and the device performance is accordingly reduced.

SUMMARY

The present invention provides a memory device, in which the refraction index of a portion of the nitride layer (serving as a contact etching stop layer) adjacent to the gate structure is less than the refraction index of the remaining portion of the nitride layer.

The present invention provides a manufacturing method to manufacture the said memory device.

A memory device of the present invention includes a first gate structure, a second gate structure, an oxide layer and a nitride layer. The first gate structure and the second gate structure are disposed on a substrate. The oxide layer covers the first gate structure. The nitride layer is disposed on the substrate and covers the oxide and the second gate structure. The refraction index of a portion of the nitride layer adjacent to an interface between the nitride layer and each of the first gate structure and the second gate structure is about 5% to 10% less than the refraction index of the remaining portion of the nitride layer.

In an embodiment of the present invention, the first gate structure is a floating gate structure, and the second gate structure is a select gate structure.

In an embodiment of the present invention, a thickness of the portion of the nitride layer adjacent to the interface between the nitride layer and each of the first gate structure and the second gate structure is about 1% to 10% of a thickness of the nitride layer.

A memory device of the present invention includes a first gate structure, a second gate structure, an oxide layer, a first nitride layer and a second nitride layer. The first gate structure and the second gate structure are disposed on a substrate. The oxide layer covers the first gate structure. The first nitride layer is disposed on the substrate and covers the oxide layer and the second gate structure. The second nitride layer is disposed on the first nitride layer. The refraction index of the first nitride layer is about 5% to 10% less than the refraction index of the second nitride layer.

In an embodiment of the present invention, the first gate structure is a floating gate structure, and the second gate structure is a select gate structure.

In an embodiment of the present invention, a thickness of the first nitride layer is about 1% to 10% of a total thickness of the first nitride layer and the second nitride layer.

A manufacturing method of a memory device includes the following steps. A first gate structure and a second gate structure are formed on a substrate. Thereafter, an oxide layer is formed on a surface of the first gate structure. Afterwards, a chemical vapor deposition process is performed to form a nitride layer on the substrate, and the nitride layer covers the oxide layer and the second gate structure. In the chemical vapor deposition process, a RF power supply increases a power from zero to a predetermined final power, such that a refraction index of a portion of the nitride layer adjacent to an interface between the nitride layer and each of the first gate structure and the second gate structure is about 5% to 10% less than a refraction index of a remaining portion of the nitride layer.

In an embodiment of the present invention, the first gate structure is a floating gate structure, and the second gate structure is a select gate structure.

In an embodiment of the present invention, a thickness of the portion of the nitride layer adjacent to the interface between the nitride layer and each of the first gate structure and the second gate structure is 1% to 10% of a thickness of the nitride layer.

In an embodiment of the present invention, a method of forming the oxide layer includes the following steps. An oxide material layer is formed conformally on the substrate. A patterning process is performed to remove a portion of the oxide material layer, leaving the oxide material layer on a surface of the first gate structure.

In an embodiment of the present invention, the predetermined final power is between about 300 W and 500 W.

In an embodiment of the present invention, the RF power supply increases the power from zero to the predetermined final power at a rate of about 3,000 W/sec to 10,000 W/sec.

In an embodiment of the present invention, the RF power supply increases the power from zero to the predetermined final power in a period of about 0.01 second to 1 second.

In view of the foregoing, in the present invention, a nitride layer (serving as a contact etching stop layer) adjacent to the gate structure is formed to have a smaller refraction index, i.e., containing less Si—H bonding, so that the nitride layer as a contact etching stop layer has better quality with fewer defects. Therefore, after the subsequently formed memory device is programmed, in a high temperature environment, the nitride layer of the invention can prevent the charge stored in the floating gate from accumulating in a region of the floating gate near the contact etch stop layer, thereby avoiding decrease in the amount of current flowing through the channel region and avoiding decrease in the device performance.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
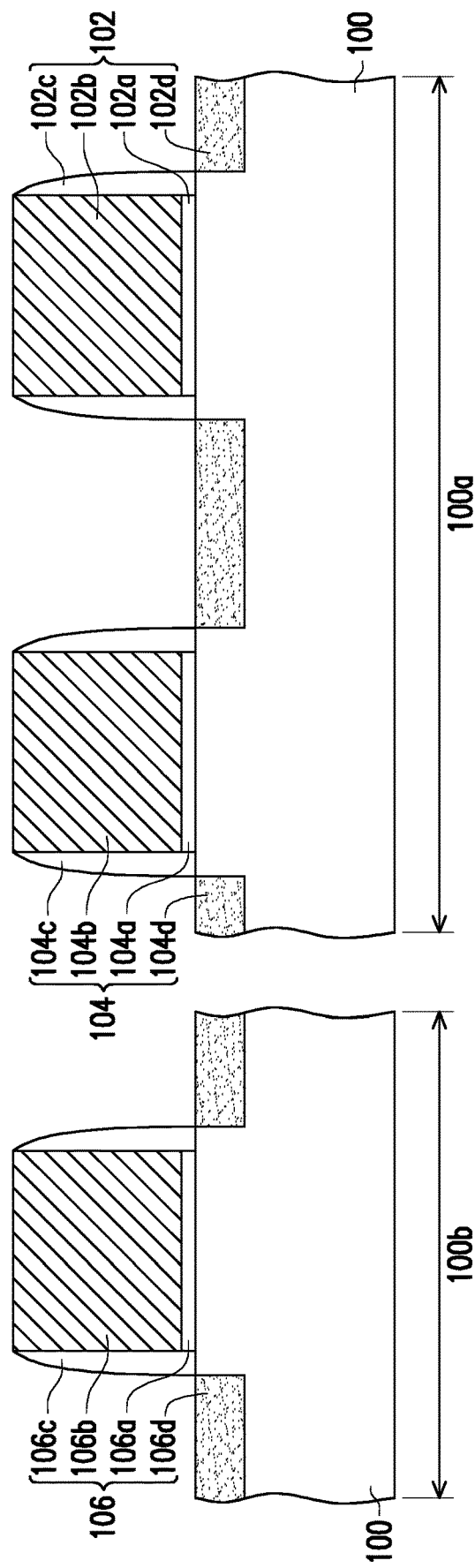
FIG. 1A to FIG. 1C are schematic cross-sectional views of a manufacturing method of a memory device according to a first embodiment of the present invention.

Hereinafter, the embodiments of the present invention will be described with reference to the drawings. In the drawings, the shapes, dimensions, proportions, etc. of various elements may be exaggerated or reduced for clarity of illustration.

Figure 1B:
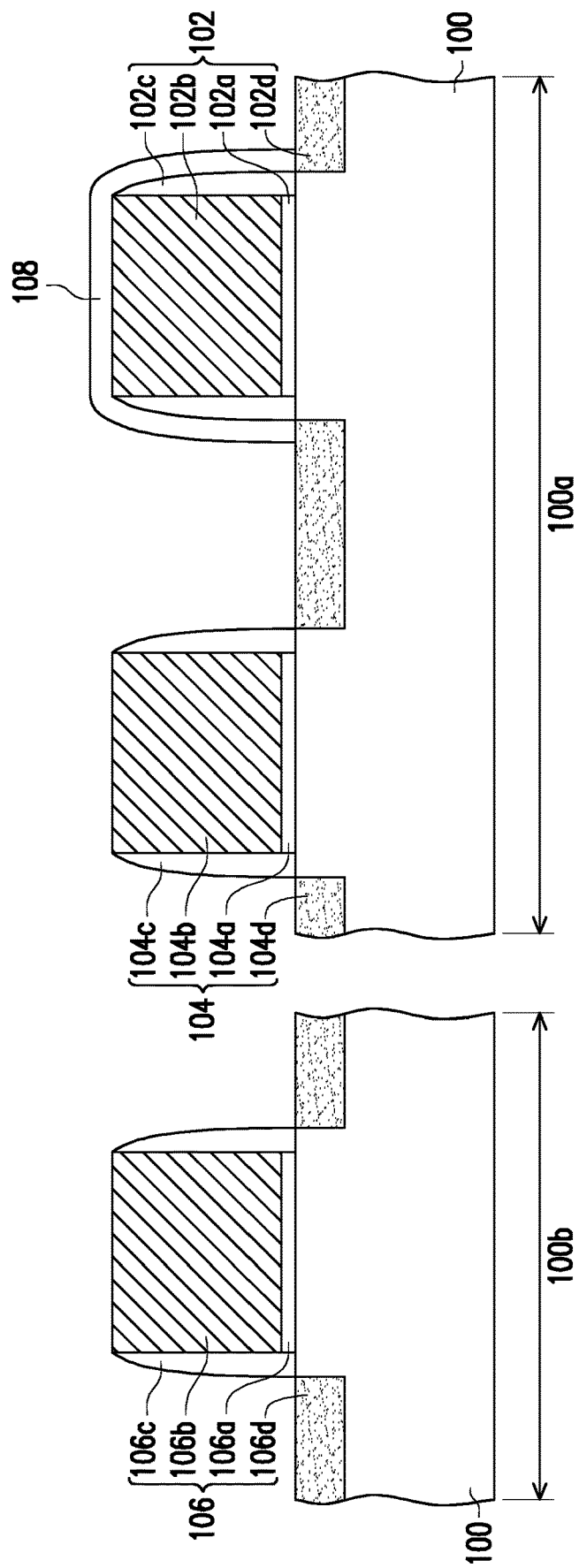
Figure 1C:
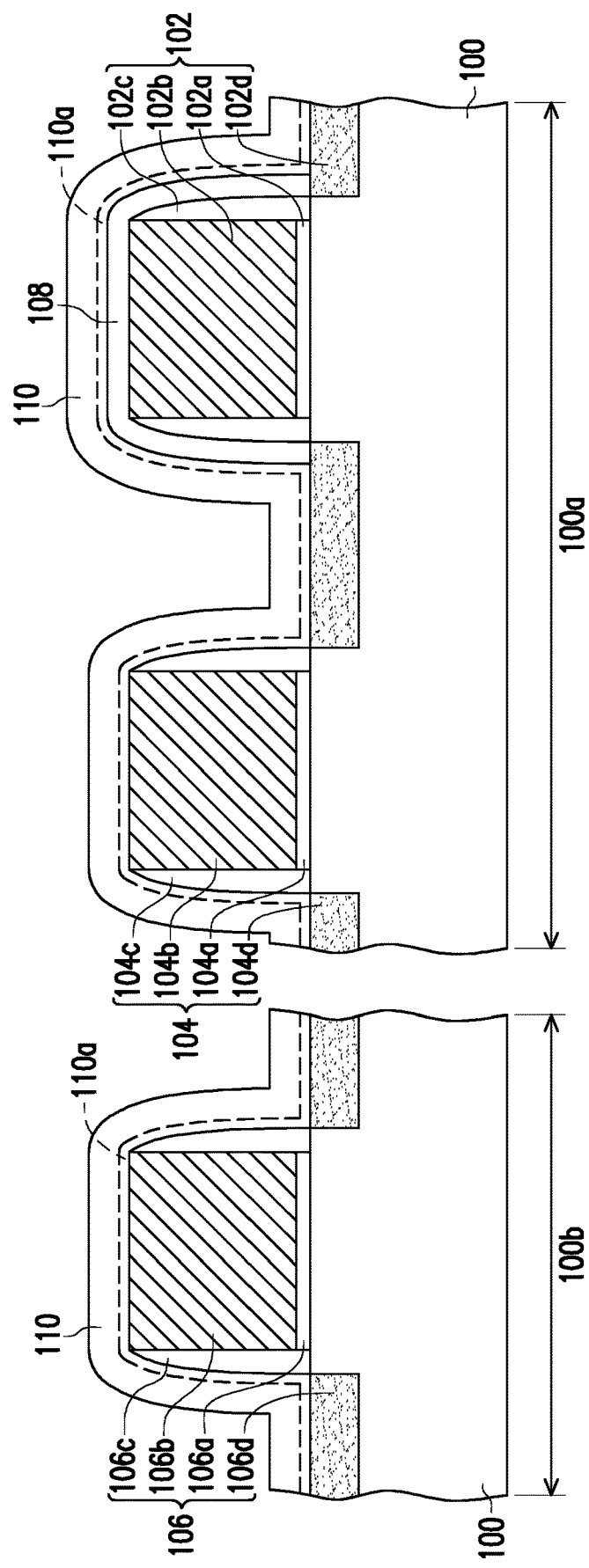

FIG. 1A to FIG. 1C are schematic cross-sectional views of a manufacturing method of a memory device according to a first embodiment of the present invention.

Referring to FIG. 1A, a substrate 100 is provided. The substrate 100 can be a silicon substrate. The substrate 100 has a memory device region 100a and a peripheral circuit region 100b. In the following processes, various memory devices are formed in the memory device region 100a, and various logic devices are formed in the peripheral circuit region 100b. Thereafter, a gate structure 102 and a gate structure 104 are formed on the substrate 100 in the memory device region 100a, and a gate structure 106 is formed on the substrate 100 in the peripheral circuit region 100b.

In the present embodiment, the gate structure 102, the gate structure 104 and the gate structure 106 are formed in the same process steps. For example, a gate dielectric material layer (such as an oxide layer formed by a thermal oxidation process) is first formed on the substrate 100. Thereafter, a gate material layer (such as a polysilicon layer formed by a chemical vapor deposition process) is formed on the gate dielectric material layer. A patterning process is then patterned to remove portions of the gate material layer and the gate dielectric material layer, so as to form a gate dielectric layer 102a, a gate 102b on the gate dielectric layer 102a, a gate dielectric layer 104a and a gate 104b on the gate dielectric layer 104a on the substrate 100 in the memory device region 100a, and form a gate dielectric layer 106a and a gate 106b on the gate dielectric layer 106a on the substrate 100 in the peripheral circuit region 100b. Thereafter, a spacer 102c, a spacer 104c and a spacer 106c are respectively formed on the sidewalls of the gate 102b, the gate 104b and the gate 106b. Afterwards, doped regions 102d, doped regions 104d and doped regions 106d are formed in the substrate 100 respectively beside the gate 102b, the gate 104b and the gate 106b.

In the present embodiment, the gate structure 102 includes the gate dielectric layer 102a, the gate 102b, the spacer 102c and the doped regions 102d, and serves as a floating gate structure of the memory device. Besides, the gate structure 104 includes the gate dielectric layer 104a, the gate 104b, the spacer 104c and the doped regions 104d, and serves as a select gate structure of the memory device. In the present embodiment, the gate structure 102 and the gate structure 104 share the doped region therebetween, but the present invention is not limited thereto. Besides, the gate structure 106 includes the gate dielectric layer 106a, the gate 106b, the spacer 106c and the doped regions 106d, and serves as a switching device of a control circuit.

Referring to FIG. 1B, an oxide layer 108 is formed on the surface of the gate structure 102. The oxide layer 108 serves as a salicide (self-aligned silicide) block (SAB) layer to prevent a salicide from forming on the exposed surface of the gate 102b. In some embodiments, in order to further reduce the resistance values of the gate 104b and the gate 106b, a salicide may be optionally formed on the exposed surfaces of the gate 104b and the gate 106b. At this time, since the oxide layer 108 covers the surface of the gate structure 102, the oxide layer 108 prevents a salicide from forming on the exposed surface of the gate 102b. In some embodiments, the method of forming the oxide layer 108 includes forming an oxide material layer conformally on the substrate 100, and performing a patterning process to the oxide material layer so as to remove a portion of the oxide material layer, leaving the oxide material layer on the surface of the first gate structure 102.

Referring to FIG. 1C, a chemical vapor deposition process is performed to form a nitride layer 110 on the substrate 100. In some embodiments, the nitride layer 110 covers the oxide layer 108, the gate structure 104 and the gate structure 106, and serves as a contact etching stop layer. The material of the nitride layer 110 is usually silicon nitride, and in the above chemical vapor deposition process, the presence of a hydrogen-containing material in the external environment inevitably generates Si—H bonding in the nitride layer 110 to cause defects. Therefore, in the present embodiment, when the chemical vapor deposition process is performed, a RF power supply increases a power from zero to a predetermined final power in a period of about 0.01 second to 1 second. In some embodiments, the predetermined final power can be between about 300 W and 500 W, and the RF power supply increases the power from zero to the predetermined final power at a rate of about 3,000 W/sec to 10,000 W/sec. Accordingly, the nitride layer can be quickly formed, and the nitride layer can be formed with less Si—H bonding and better quality{with fewer defects}. After the power is increased from zero to the predetermined final power, the final power is maintained until the desired thickness of the nitride layer 110 is obtained. That is, in the resulting nitride layer 110, the refraction index of a portion 110a of the nitride layer 110 adjacent to an interface between the nitride layer 110 and each of the gate structures 102, 104 and 106 is less than the refraction index of the remaining portion of the nitride layer 110. Besides, the RF power supply increases the power from zero to the predetermined final power in a period of about 0.01 second to 1 second, such that the refraction index of the portion 110a is about 5-10% less than the refraction index of the remaining portion of the nitride layer 110.

Therefore, after the subsequently formed memory device is programmed, in a high temperature environment, the nitride layer 110 of the invention can prevent the charge stored in the floating gate (gate 102b) from accumulating in a region of the floating gate near the contact etch stop layer (nitride later 110), thereby avoiding decrease in the amount of current flowing through the channel region and avoiding decrease in the device performance.

It is noted that, since the RF power supply increases the power from zero to the predetermined final power in a period of about 0.01 second to 1 second, the nitride layer (i.e., portion 110a) with low refraction index formed in such short period has a very small thickness, and thus, it does not seriously affect the electrical characteristics of the gate structure 104 and gate structure 106. Besides, in the nitride layer 110 formed by the above method, the thickness of the portion 110a is about 1% to 10% of the thickness of the nitride layer 110. For example, when the thickness of the nitride layer 110 is about 800 Å, the thickness of the portion 110a is about 10 Å.

Figure 2A:
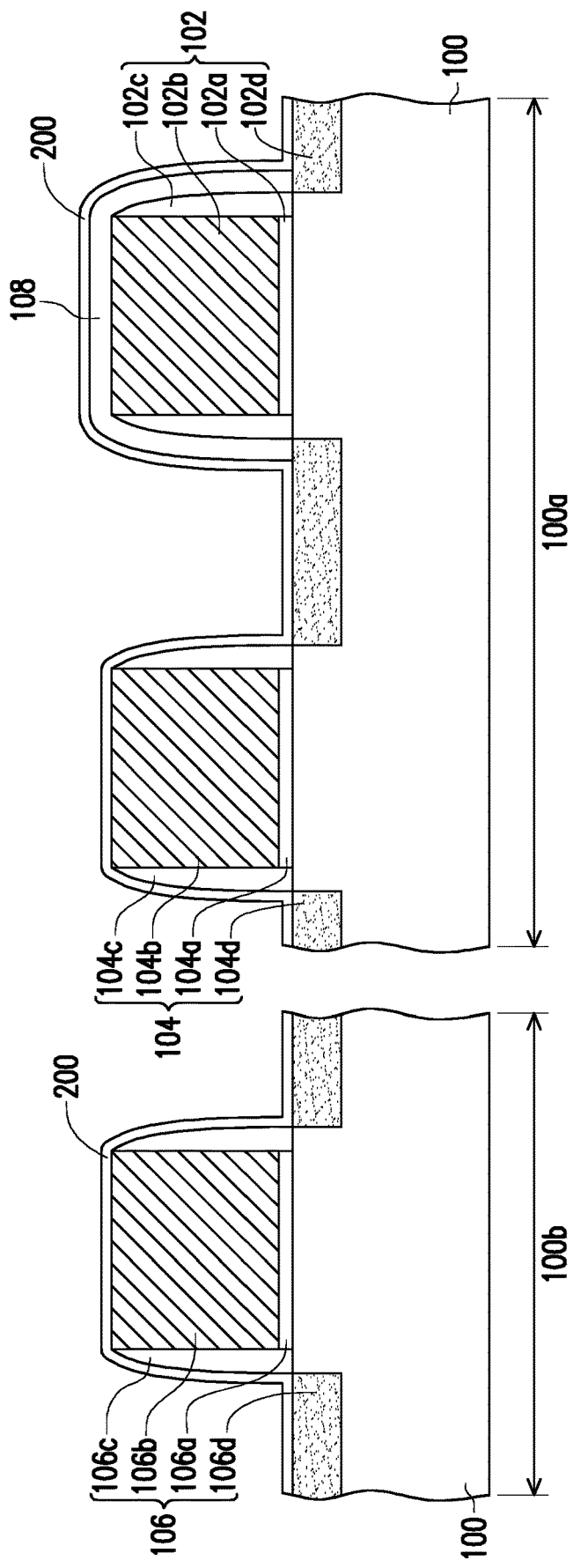
FIG. 2A to FIG. 2B are schematic cross-sectional views of a manufacturing method of a memory device according to a second embodiment of the present invention.
Figure 2B:
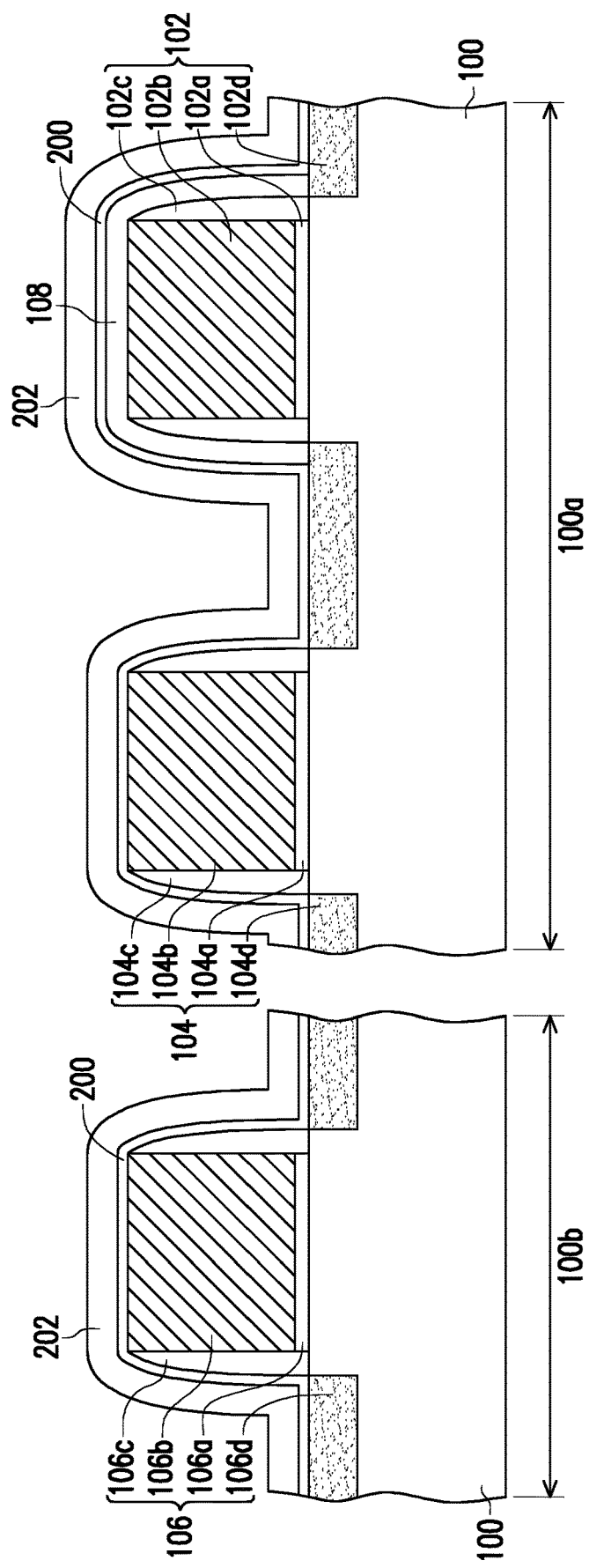

FIG. 2A to FIG. 2B are schematic cross-sectional views of a manufacturing method of a memory device according to a second embodiment of the present invention. In the following, the same elements described above will be denoted by the same reference numerals, and will not be separately described.

Referring to FIG. 2A, after the step of FIG. 1B, a nitride layer 200 is formed on the substrate 100 and covers the oxide layer 108, the gate structure 104 and the gate structure 106. The material of the nitride layer 200 is usually silicon nitride. In the present embodiment, the refraction index of the nitride layer 200 is about 5% to 10% less than the refraction index of another overlying nitride layer. The nitride layer 200 can be formed by any known method. For example, the nitride layer 200 can be formed by adjusting various process parameters of a chemical vapor deposition process, e.g., reducing the flow rate of silane, increasing the power supplied by the RF power supply, increasing the power rate of the RF power supply, etc. Alternatively, the method of FIG. 1C can be performed to form the nitride layer 200, in which the RF power supply increases the power from zero to the predetermined final power in a period of about 0.01 second to 1 second.

Referring to FIG. 2B, a nitride layer 202 is formed on the nitride layer 200. The material of the nitride layer 202 is usually silicon nitride. The nitride layer 202 can be formed by any known method. In the present embodiment, the nitride layer 200 and the nitride layer 202 constitute the required contact etching stop layer, and the thickness of the nitride layer 200 can be about 1% to 10% of the total thickness of the nitride layer 200 and the nitride layer 202. Accordingly, since the nitride layer 200 with low refraction index has a very small thickness, it does not seriously affect the electrical characteristics of the gate structure 104 and gate structure 106.

In the present embodiment, the refraction index of the nitride layer 200 is about 5% to 10% less than the refraction index of the nitride layer 202, i.e., the nitride layer 200 contains less Si—H bonding, and thus, after the subsequently formed memory device is programmed, in a high temperature environment, the nitride layer 200 of the invention can prevent the charge stored in the floating gate (gate 102b) from accumulating in a region of the floating gate near the contact etch stop layer (nitride layer 200), thereby avoiding decrease in the amount of current flowing through the channel region and avoiding decrease in the device performance.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory device, comprising:
    a first gate structure and a second gate structure, disposed on a substrate;
    an oxide layer, covering the first gate structure; and
    a nitride layer, disposed on the substrate and covering the oxide layer and the second gate structure,
    wherein a refraction index of a portion of the nitride layer adjacent to an interface between the nitride layer and each of the first gate structure and the second gate structure is about 5% to 10% less than a refraction index of a remaining portion of the nitride layer.

2. The memory device of claim 1, wherein the first gate structure is a floating gate structure, and the second gate structure is a select gate structure.

3. The memory device of claim 1, wherein a thickness of the portion of the nitride layer adjacent to the interface between the nitride layer and each of the first gate structure and the second gate structure is about 1% to 10% of a thickness of the nitride layer.

4. A memory device, comprising:
    a first gate structure and a second gate structure, disposed on a substrate;
    an oxide layer, covering the first gate structure;
    a first nitride layer, disposed on the substrate and covering the oxide layer and the second gate structure; and
    a second nitride layer, disposed on the first nitride layer,
    wherein a refraction index of the first nitride layer is about 5% to 10% less than a refraction index of the second nitride layer.

5. The memory device of claim 4, wherein the first gate structure is a floating gate structure, and the second gate structure is a select gate structure.

6. The memory device of claim 4, wherein a thickness of the first nitride layer is about 1% to 10% of a total thickness of the first nitride layer and the second nitride layer.

7. A manufacturing method of a memory device, comprising:
    forming a first gate structure and a second gate structure on a substrate;
    forming an oxide layer on a surface of the first gate structure; and
    performing a chemical vapor deposition process to form a nitride layer on the substrate, the nitride layer covering the oxide layer and the second gate structure,
    wherein in the chemical vapor deposition process, a RF power supply increases a power from zero to a predetermined final power, such that a refraction index of a portion of the nitride layer adjacent to an interface between the nitride layer and each of the first gate structure and the second gate structure is about 5% to 10% less than a refraction index of a remaining portion of the nitride layer.

8. The manufacturing method of claim 7, wherein the first gate structure is a floating gate structure, and the second gate structure is a select gate structure.

9. The manufacturing method of claim 7, wherein a thickness of the portion of the nitride layer adjacent to the interface between the nitride layer and each of the first gate structure and the second gate structure is about 1% to 10% of a thickness of the nitride layer.

10. The manufacturing method of claim 9, wherein a method of forming the oxide layer comprises:

forming an oxide material layer conformally on the substrate; and performing a patterning process to remove a portion of the oxide material layer, leaving the oxide material layer on a surface of the first gate structure.

11. The manufacturing method of claim 7, wherein the predetermined final power is between about 300 W and 500 W.

12. The manufacturing method of claim 11, wherein the RF power supply increases the power from zero to the predetermined final power at a rate of about 3,000 W/sec to 10,000 W/sec.

13. The manufacturing method of claim 7, wherein the RF power supply increases the power from zero to the predetermined final power in a period of about 0.01 second to 1 second.

* * * * *